(12) United States Patent
Yu et al.

(10) Patent No.: US 7,871,139 B2
(45) Date of Patent: Jan. 18, 2011

(54) SLIDE RAIL ASSEMBLY

(75) Inventors: Mo-Ming Yu, Shenzhen (CN); Hai-Chen Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 260 days.

(21) Appl. No.: 12/202,328

(22) Filed: Sep. 1, 2008

(65) Prior Publication Data

US 2009/0289155 A1 Nov. 26, 2009

(30) Foreign Application Priority Data

May 23, 2008 (CN) .......................... 2008 1 0301759

(51) Int. Cl.
A47B 95/00 (2006.01)
(52) U.S. Cl. ................................................ 312/333
(58) Field of Classification Search ................. 312/333, 312/334.44, 334.46–334.47; 284/21
See application file for complete search history.

(56) References Cited

U.S. PATENT DOCUMENTS

| | | | | |
|---|---|---|---|---|
| 6,373,707 B1 * | 4/2002 | Hutchins | ..................... | 312/333 |
| 6,588,866 B2 * | 7/2003 | Cheng | ..................... | 312/334.7 |
| 7,382,623 B2 * | 6/2008 | Hartman | ..................... | 312/333 |
| 7,481,504 B2 * | 1/2009 | Chen et al. | ..................... | 312/333 |
| 7,513,581 B1 * | 4/2009 | Baiza et al. | ..................... | 312/333 |
| 7,520,577 B2 * | 4/2009 | Chen et al. | ..................... | 312/334.46 |
| 7,571,968 B2 * | 8/2009 | Ji et al. | ..................... | 312/333 |
| 2004/0239221 A1 * | 12/2004 | Yang | ..................... | 312/334.46 |
| 2005/0180667 A1 * | 8/2005 | Chen et al. | ..................... | 384/21 |
| 2005/0206284 A1 * | 9/2005 | Dubon et al. | ..................... | 312/333 |
| 2006/0091769 A1 * | 5/2006 | Dubon | ..................... | 312/333 |
| 2007/0018547 A1 * | 1/2007 | Yang et al. | ..................... | 312/333 |
| 2007/0296318 A1 * | 12/2007 | Peng et al. | ..................... | 312/334.44 |

* cited by examiner

*Primary Examiner*—Hanh V Tran
(74) *Attorney, Agent, or Firm*—Zhigang Ma

(57) ABSTRACT

A slide rail assembly is capable of being attached to a chassis associated with a post extending therefrom. The slide rail assembly includes a slide rail defining a mounting slot for receiving the post, a retaining member having a mounting portion fixed to the slide rail, an intermediate member slidably attached to the slide rail, and a releasing member pivoted connecting to the retaining member. The intermediate member includes a cutout configured to receive the post and be aligned with the mounting slot of the slide rail. The retaining member is capable of keeping the intermediate member from sliding with respect to the slide rail. The releasing member is capable of being pivoted to enable the intermediate member to slide with respect to the slide rail.

20 Claims, 7 Drawing Sheets

SLIDE RAIL ASSEMBLY

BACKGROUND

1. Field of the Invention

The present invention relates to slide rail assemblies, and more particularly to a slide rail assembly including a mounting mechanism and a slide rail capable of being retained to a chassis with the mounting mechanism.

2. Description of Related Art

A typical slide rail assembly for a server chassis and a rack includes an outer slide rail mounted to the rack, an inner slide rail mounted to the chassis, and an intermediate slide rail mounted between the outer and inner slide rails. The intermediate slide rail is extendable relative to the outer slide rail, and the inner slide rail is extendable relative to the intermediate slide rail, thus the chassis can be extended a distance out from the rack. Conventionally, the inner rail is secured to a side of the chassis with a plurality of screws. Therefore, a tool such as a screwdriver is needed for installing and detaching the slide rail, and the processes are tedious and time consuming.

DETAILED DESCRIPTION

Figure 1:
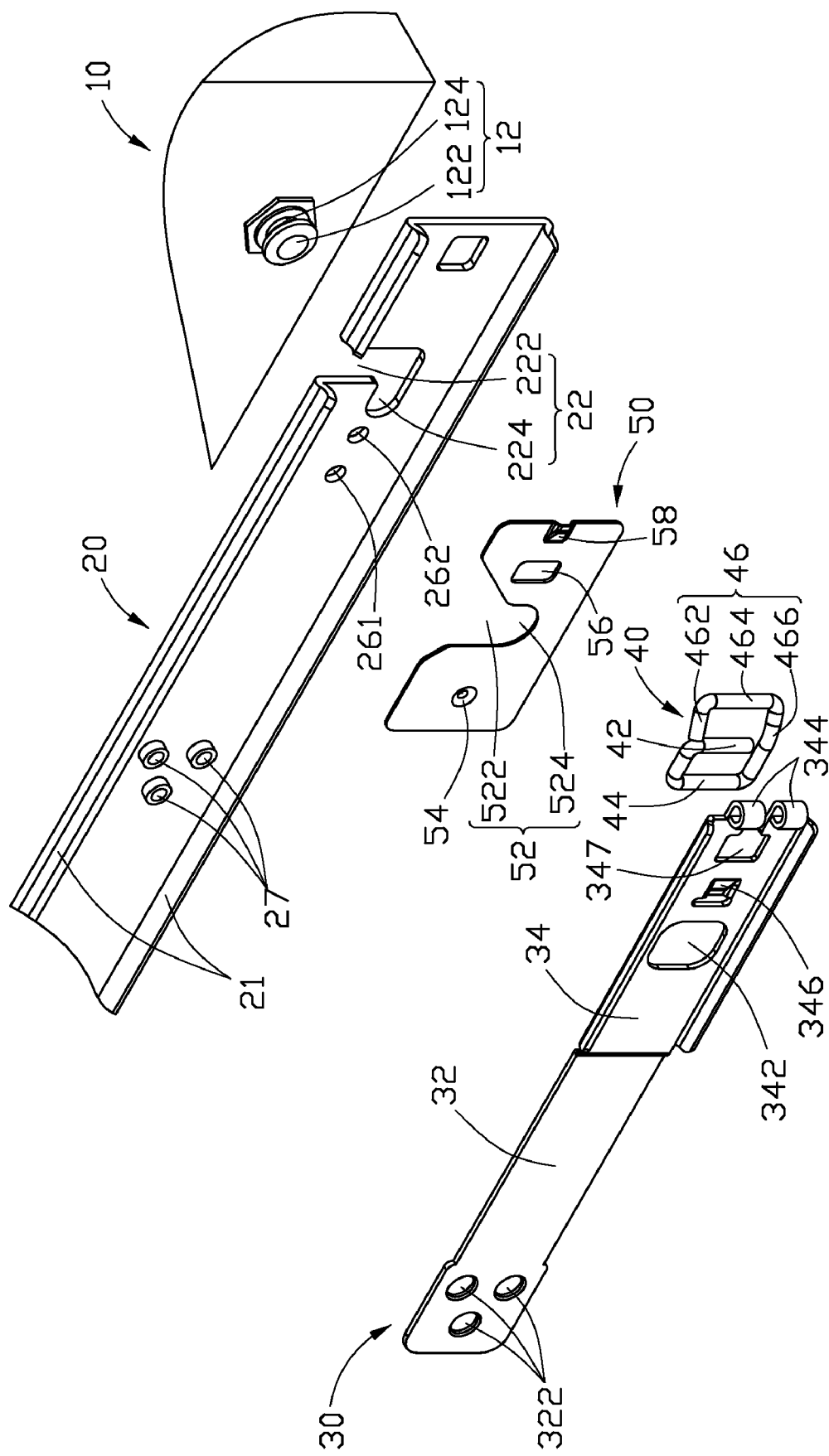
FIG. 1 is an exploded, isometric view of a mounting mechanism according to an embodiment of the present invention.
Figure 2:
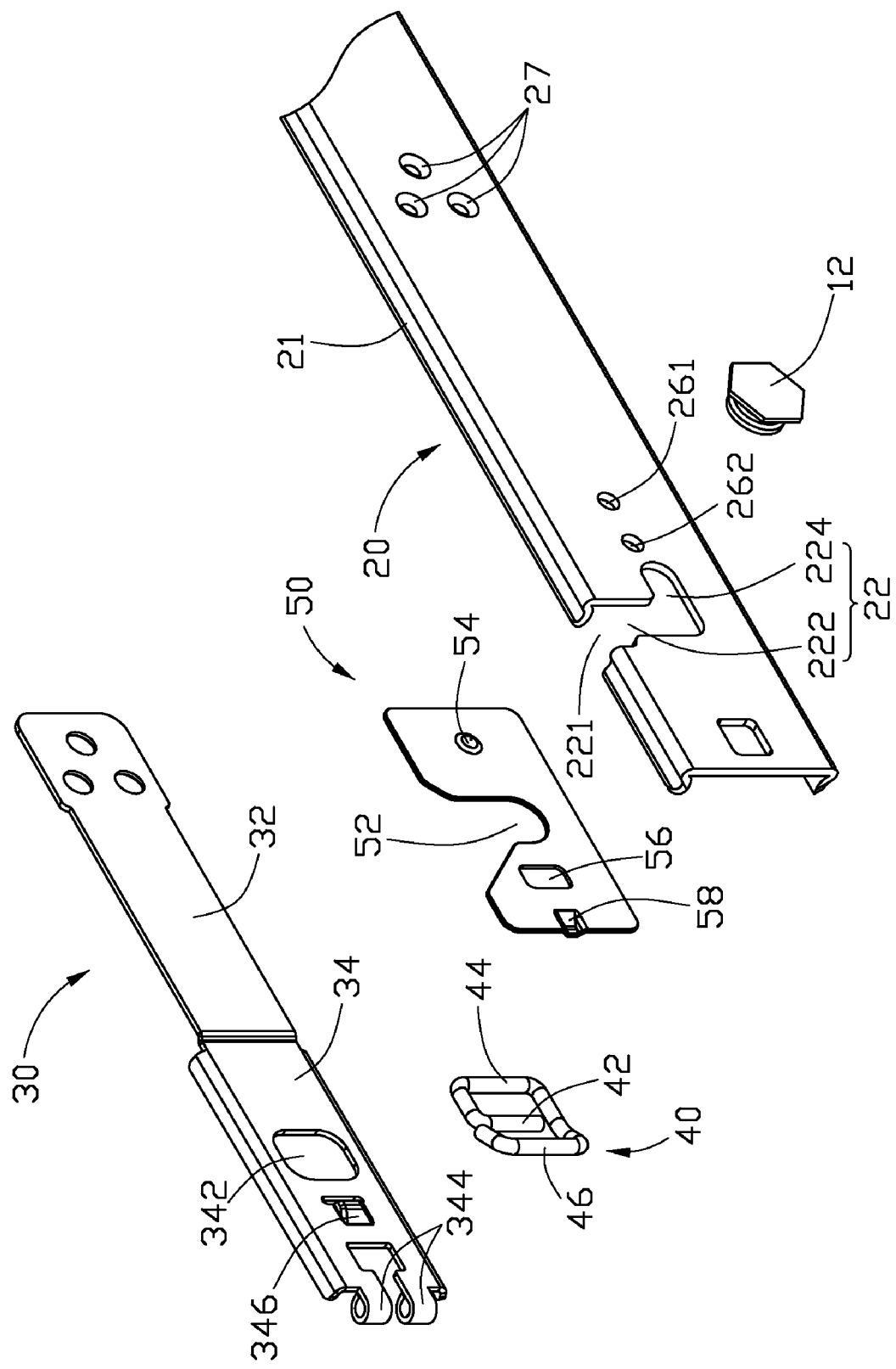
FIG. 2 is similar to FIG. 1, but shown from another aspect.

Referring to FIGS. 1 and 2, a mounting mechanism in an embodiment of the present invention is provided for mounting a slide rail 20 to a chassis 10. The mounting mechanism includes a retaining member 30 coupled to the slide rail 20, a releasing member 40 rotatably coupled to the retaining member 30, and an intermediate member 50 slidably attached to the slide rail 20.

The chassis 10 includes an anchor member 12 extending from a sidewall thereof. The anchor member 12 is a mushroom-shaped post, and includes a cap 122 and a shank 124 with a diameter smaller than that of the cap 122.

The slide rail 20 includes a pair of flanges 21 extending from opposite edges towards the same direction. A mounting slot 22 is defined in the slide rail 20. The mounting slot 22 includes an accessing portion 222 and a fixing portion 224 communicating with the accessing portion 222. A plurality of protrusions 27 extends from the slide rail 20. Two positioning holes 261 and 262 are defined in the slide rail 20 and arranged along a longitudinal direction of the slide rail 20. The positioning hole 262 is located closer to the mounting slot 22 than to the positioning hole 261.

The retaining member 30 is a resilient plate and includes a mounting portion 32 and a locking portion 34 extending from an end of the mounting portion 32. A plurality of coupling holes 322 is defined in a far end of the mounting portion 32 relative to the locking portion 34. Two flanges extend from opposite side edges of the locking portion 34 for reinforcing the locking portion 34. A pivoting portion 344, which includes a pair of offset hollowed cylinders, is formed on a far end of the locking portion 34 relative to the mounting portion 32. A notch 347 is defined in the locking portion 34 adjacent to the pivoting portion 344. The locking portion 34 also includes an interference avoiding hole 342 defined in the middle thereof, and a tab 346 formed thereon between the interference avoiding hole 342 and the notch 347.

The releasing member 40 is generally B-shaped, and includes a pivoting shaft 42, an operating portion 44, and a resisting portion 46 disposed at opposite sides of the pivoting shaft 42. The resisting portion 46 includes a resisting pole 464, and a first arm 462 and a second arm 466 perpendicularly extending from opposite ends of the resisting pole 464. The second arm 466 connects to the operating portion 44 and is slightly bent, and therefore the operating portion 44, the pivoting shaft 42 and the resisting portion 46 are un-coplanar.

The intermediate member 50 is a planar sheet. A substantially V-shaped cutout 52 is defined in the intermediate member 50 near a side edge. The cutout 52 includes a gateway 522 and a receiving portion 524 communicating with the gateway 522. The intermediate member 50 includes a cone-shaped locating portion 54 protruding therefrom and a retaining hole 56 defined therein. The locating portion 54 and the retaining hole 56 are arranged at opposite sides of the cutout 52, respectively. A bulge 58 is formed from an edge of the intermediate member 50 near the retaining hole 56.

Figure 3:
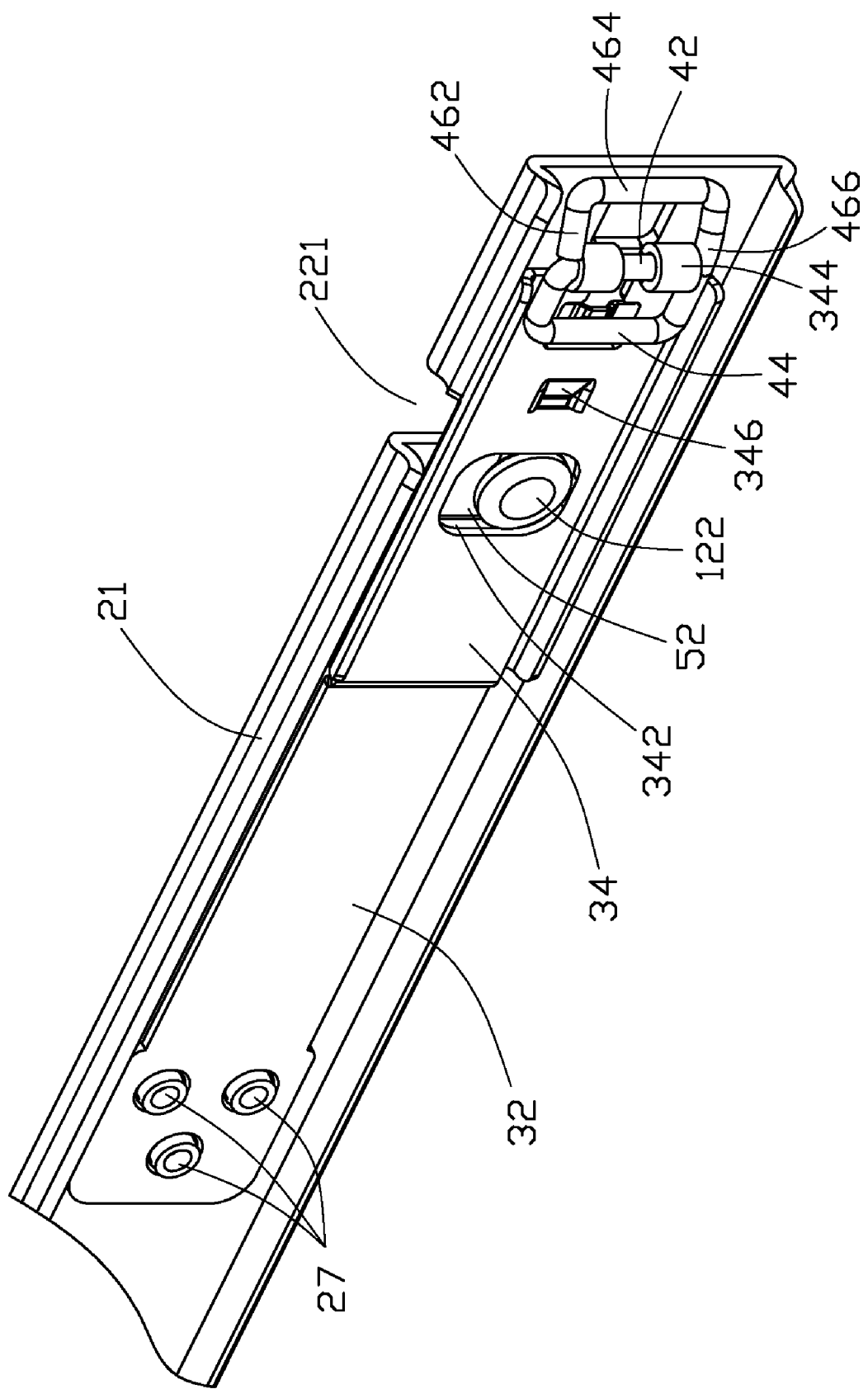
FIG. 3 is an assembled view of the mounting mechanism of FIG. 1.
Figure 4:
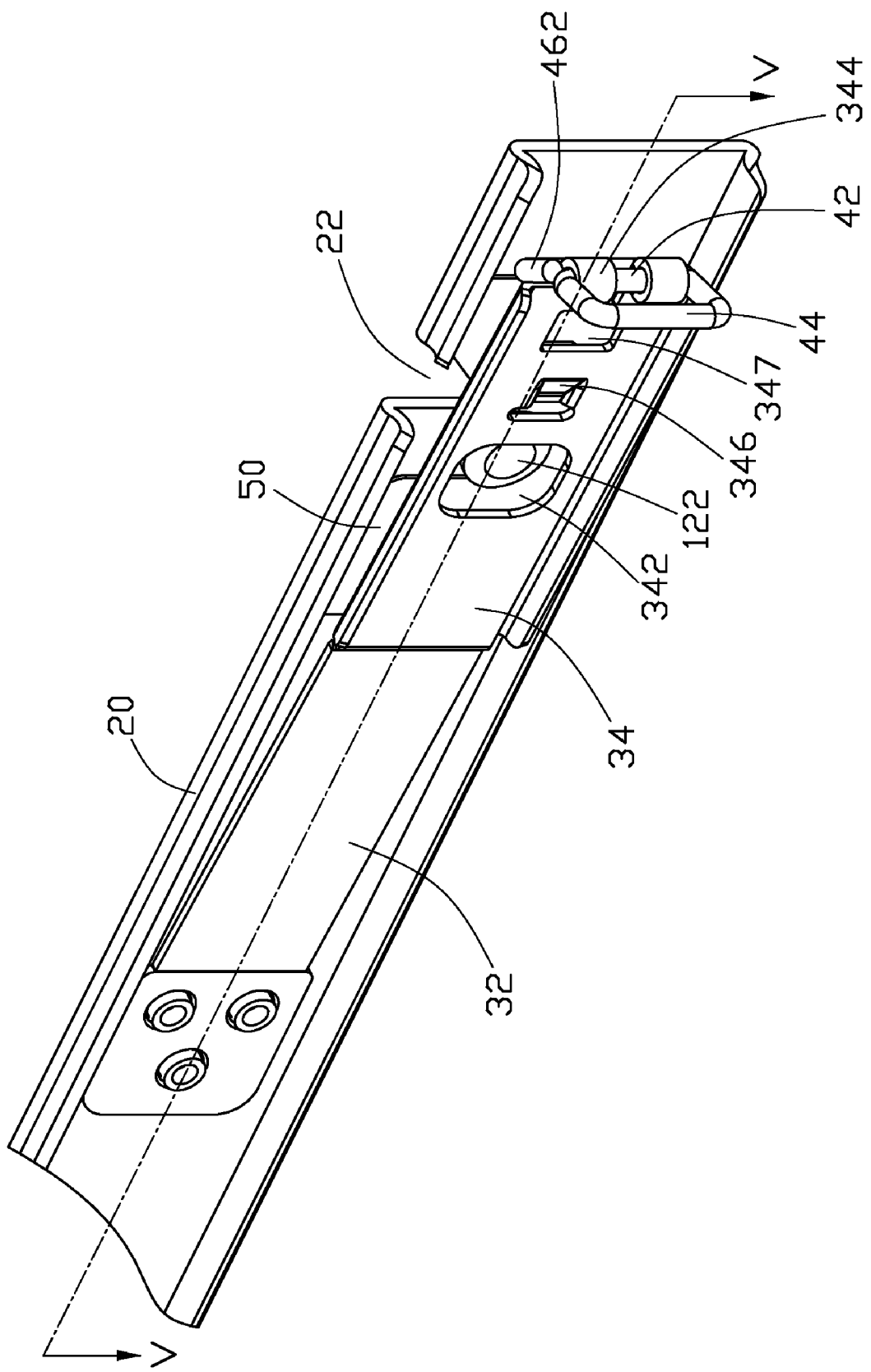
FIG. 4 is another assembled view of the mounting mechanism of FIG. 1.
Figure 5:
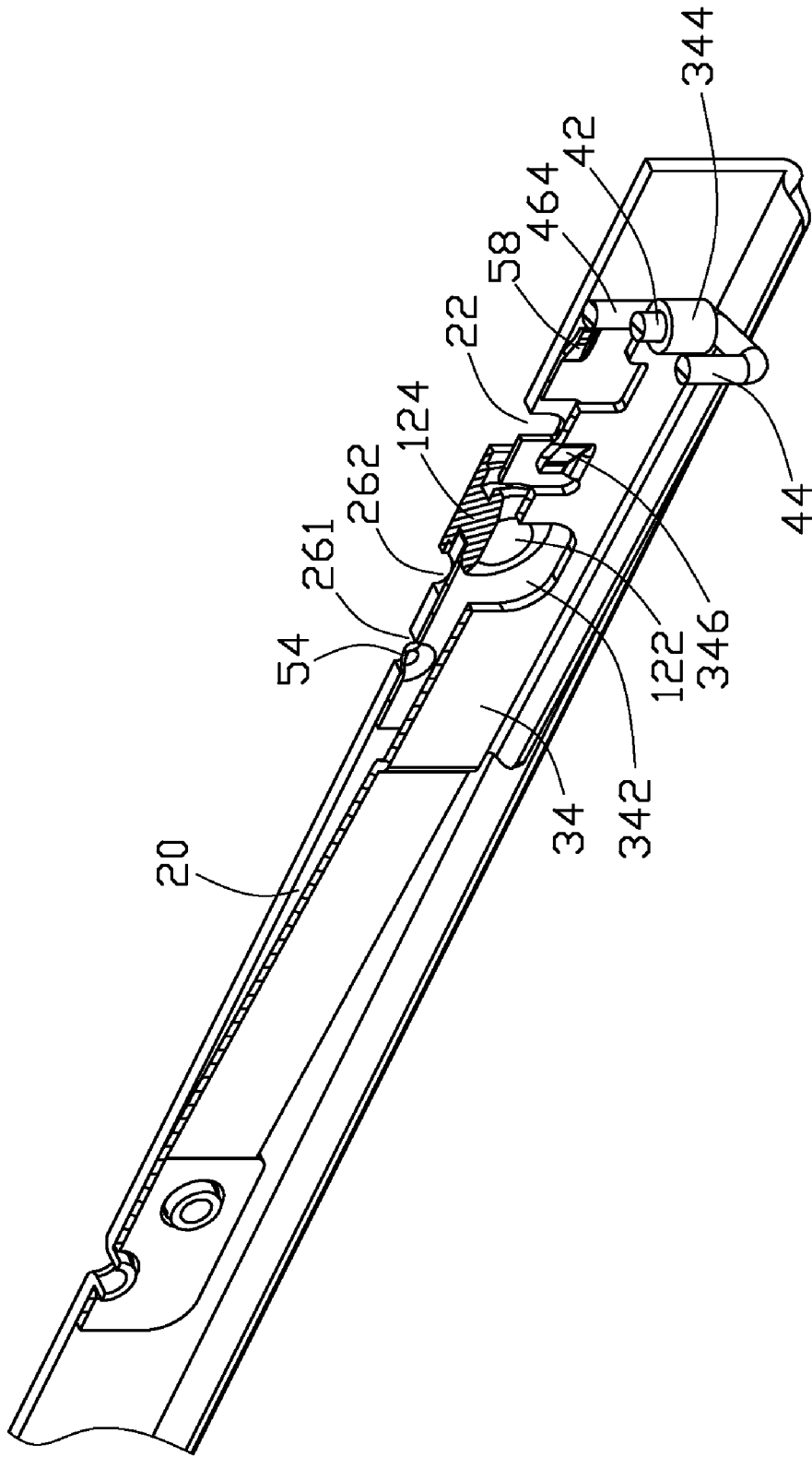
FIG. 5 is a sectional view of FIG. 4 taken along the line V-V.

Referring also to FIGS. 3, 4 and 5, in assembly of the mounting apparatus and the slide rail 20, the intermediate member 50 abuts against the slide rail 20 and is slidably restricted between the two flanges 21. The locating portion 54 engages with the positioning hole 262 of the slide rail 20. The gateway 522 of cutout 52 is aligned with the accessing portion 222 of the mounting slot 22. The shaft 42 of the releasing member 40 passes through the pivoting portion 32 of the retaining member 30. The protrusions 27 of the slide rail 20 are correspondingly fixed in the coupling holes 34 of the retaining member 30 to attach the mounting portion 32 to the slide rail 20. The mounting portion 32 and the locking portion 34 of the retaining member 30 respectively abut against the slide rail 20 and the intermediate member 50. In an initial status shown in FIG. 3, the tab 346 just extends into the cutout 52 of the intermediate member 50 and the mounting slot 22 of the slide rail 20. The operating portion 44 of the releasing member 40 engages with the retaining member 30 and is aligned with the notch 347. The resisting pole 464 of the releasing member 40 engages with the slide rail 20.

Figure 6:
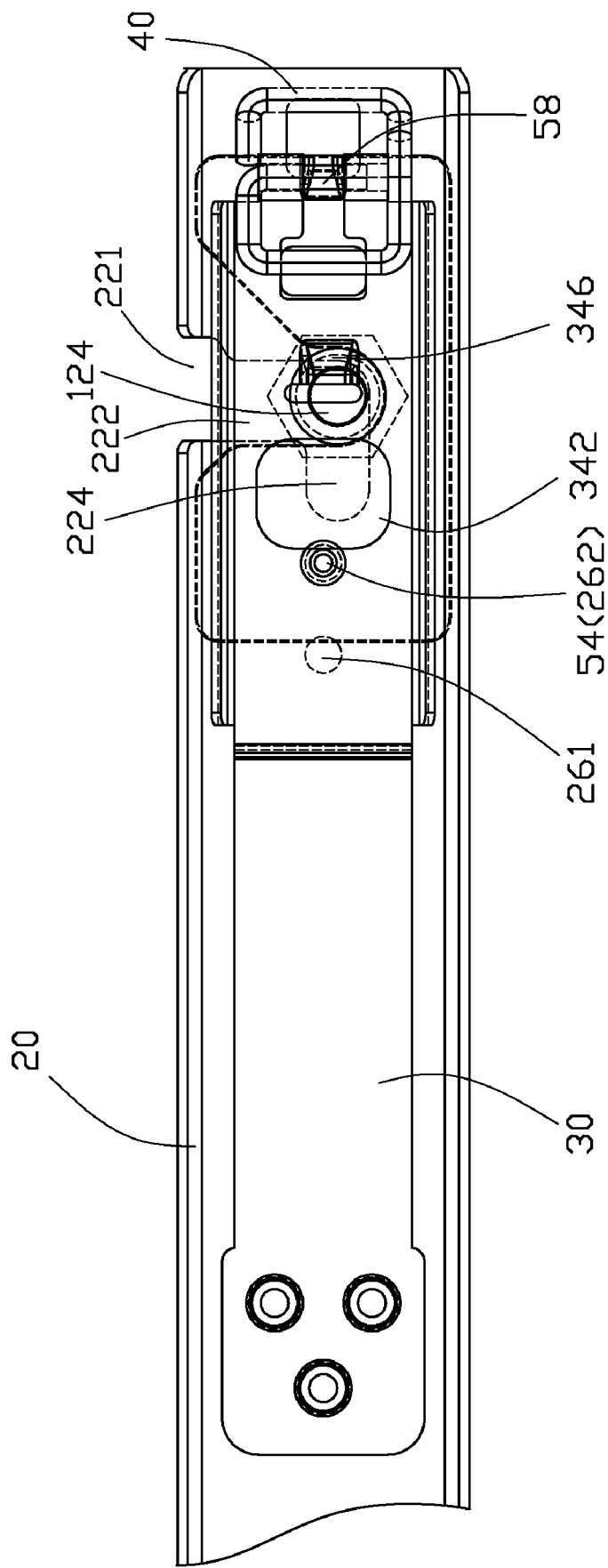
FIG. 6 is a lateral view of FIG. 3.
Figure 7:
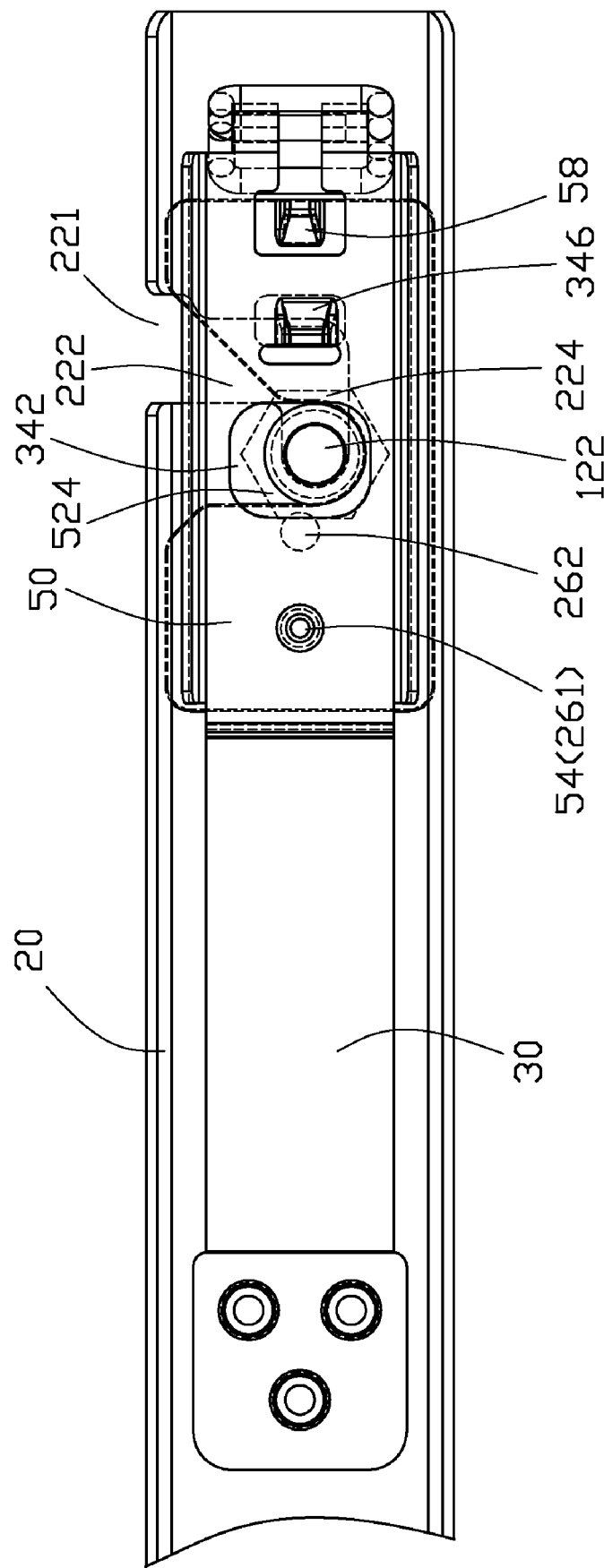
FIG. 7 is a lateral view of FIG. 4.

Referring also to FIGS. 6 and 7, to mount the slide rail 20 to the chassis 10, the chassis 10 is moved to fit the shank 124 of the anchor member 12 into the mounting slot 22. The anchor member 12 slides down along the accessing portion 222 of the mounting slot 22, then slides leftward (shown in FIG. 6) along the fixing portion 224 of the mounting slot 22. During the movement of the anchor member 12, the cap 122 of the anchor member 12 engages with the retaining member 30 and urges the locking portion 34 of the retaining member 30 to move away from the slide rail 20. Then, when the shank 124 of the anchor member 12 slides into the fixing portion 224 of the mounting slot 22, the cap 122 of the anchor member 12 extends through the interference avoiding hole 342 of the retaining member 30, the retaining member 30 is restored. At the same time, the shank 124 of the anchor member 12 engages with a left rim of the cutout 52 of the intermediate member 50 to cause the intermediate member 50 to slide leftwards. The locating portion 54 disengages from the positioning hole 262 and slides to engage with the positioning hole 261. When the retaining member 30 is in a restored situation, the tab 346 of the retaining member 30 extends into the retaining hole 56 to prevent the intermediate member 50 from sliding. Therefore, the shank 124 of the anchor member 12 is retained in the fixing portion 224 of the mounting slot 22. The slide rail 20 is secured to the chassis 10.

To detach the slide rail 20 from the chassis 10, a finger is extended to the notch 347 to manipulate the operating portion 44 of the releasing member 40 to move away from the retaining member 30. Therefore, the releasing member 40 is pivoted about the shaft 42 to resist the resisting pole 464 against the slide rail 20. The locking portion 34 of the retaining member 30 is raised from the slide rail 20. The tab 346 of the retaining member 30 disengages from the retaining hole 56 of the intermediate member 50. The releasing member 50 is pivoted until the first arm 462 and the second arm 466 slantingly engage with the end edge of the retaining member 30. Now, the intermediate member 50 is allowed to slide relative to the slide rail 20. The chassis 10 is moved to slide the shank 124 of the anchor member 12 rightward (shown in FIG. 7) along the fixing portion 224 of the mounting slot 22. At the same time, the intermediate member 50 is urged to slide rightward by the shank 124 of the anchor member 12. The locating portion 54 disengages from the positioning hole 261 and slides to engage with the positioning hole 261. Then, the shank 124 of the anchor member 12 slides up along the accessing portion 222 of the mounting slot 22 to exit from the mounting slot. 22. Thus, the slide rail 20 is detached from the chassis 20.

After the slide rail 20 is detached from the chassis 10, the locking portion 34 of the retaining member 30 should be restored. Otherwise, another rail (such as an intermediate slide rail) may interfere with and damage the retaining member 30 when the slide rail 20 slides therein. However, the present embodiment described above can prevent this happens. That is, during the intermediate member 50 sliding rightwards, the bulge 58 engages with the resisting pole 464 of the releasing member 40. The releasing member 40 is urged to pivot to disengage the first arm 462 and the second arm 466 from the end edge of the retain member 30, so that the retaining member 30 is restored as long as the slide rail 20 is detached from the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting mechanism retaining an anchor member slidably received in a mounting slot of a slide rail, the mounting mechanism comprising:

a retaining member, wherein the retaining member comprises a mounting portion coupled to the slide rail and a locking portion resiliently connected to the mounting portion;

an intermediate member slidably engaging with the slide rail, comprising a cutout receiving the anchor member to make the intermediate member to be movable with the anchor member, wherein the locking portion of retaining member is movable between a first position where the locking portion stops the intermediate member from sliding with respect to the slide rail, and a second position where the locking portion of the retaining member disengages from the intermediate member to allow the intermediate member and the anchor member to slide with respect to the slide rail; and a releasing member pivotably coupled to the retaining member, wherein the locking portion of the retaining member moves from the first position to the second position in response to pivoting of the releasing member.

2. The mounting mechanism as described in claim 1, wherein the releasing member comprises a shaft pivotably received in a pivoting portion of the retaining member.

3. The mounting mechanism as described in claim 2, wherein the releasing member further comprises a resisting portion, and an operating portion locating at opposite sides of the shaft.

4. The mounting mechanism as described in claim 3, wherein the retaining member further comprises a notch near the pivoting portion adapted to align with the operating portion of the releasing member.

5. The mounting mechanism as described in claim 3, wherein the resisting portion of the releasing member comprises a resisting pole, the locking portion of the retaining member moves from the first position to the second position in response to the releasing member is pivoted to make the resisting pole abut against the slide rail.

6. The mounting mechanism as described in claim 5, wherein the resisting portion further comprises a pair of arms perpendicularly extending from opposite of the resisting pole and adapted to rest on an end of the retaining member.

7. The mounting mechanism as described in claim 5, wherein the intermediate member is configured to engage with the resisting portion of the releasing member and urge the releasing member to pivot.

8. The mounting mechanism as described in claim 7, wherein the intermediate member further comprises a bulge formed thereon and configured to engage with the resisting portion of the releasing member.

9. The mounting mechanism as described in claim 1, wherein the retaining member further comprises a tab protruding from the locking portion thereof, the intermediate member further comprises a retaining hole configured to receive the tab of the retaining member.

10. A slide rail assembly attached to a chassis associated with a post extending therefrom, the slide rail assembly comprising:

a slide rail comprising a mounting slot defined therein, wherein the mounting slot is receives the post;

a retaining member comprising a mounting portion fixed to the slide rail and a locking portion extending from the mounting portion, the locking portion movable between a first position and a second position;

a intermediate member slidably attached to the slide rail, wherein the intermediate member comprises a cutout receiving the post, and aligned with the mounting slot of the slide rail, the intermediate member is stopped from sliding relative to the slide rail by the retaining member in response to the locking portion in the first position; and a releasing member pivotably coupled to the retaining member, and detachable from the retaining member, wherein the locking portion of the retaining member moves from the first position to the second position in response to a pivoting of the releasing member to allow the intermediate member and the post to slide with respect to the slide rail.

11. The slide rail assembly as described in claim 10, wherein the mounting slot of the slide rail is substantially J-shaped, and comprises an accessing portion for guiding the post therein and a positioning portion communicating with the accessing portion for securely engaging with the post.

12. The slide rail assembly as described in claim 10, wherein the slide rail further comprises a pair of flanges extending from opposite edges, the intermediate member is configured to be slidably restricted between the flanges.

13. The slide rail assembly as described in claim 10, wherein the slide rail further comprises two positioning holes defined therein, the intermediate member further comprises a locating portion to selectively engage with the positioning holes during the intermediate member sliding with regard to the slide rail.

14. The mounting mechanism as described in claim 10, wherein the releasing member comprises a shaft pivotably received in a pivoting portion of the retaining member.

15. The mounting mechanism as described in claim 14, wherein the releasing member further comprises a resisting portion and an operating portion locating at opposite sides of the shaft, the resisting portion resists against the slide rail to drive the locking portion of the retaining member moves from the first position to the second position in response to pivoting of the releasing member; the retaining member further comprises a notch near the pivoting portion adapted to align with the operating portion of the releasing member.

16. The mounting mechanism as described in claim 15, wherein the resisting portion of the releasing member comprises a resisting pole configured to resist against the slide rail, and a pair of arms perpendicularly extending from opposite of the resisting pole and adapted to rest on an end of the retaining member.

17. The mounting mechanism as described in claim 15, wherein the intermediate member is configured to engage with the resisting portion of the releasing member and urge the releasing member to pivot.

18. The mounting mechanism as described in claim 17, wherein the intermediate member further comprises a bulge formed thereon and configured to engage with the resisting portion of the releasing member.

19. The mounting mechanism as described in claim 10, wherein the retaining member further comprises a tab protruding from the locking portion thereof, the intermediate member is configured to abut against the locking portion of the retaining member and further comprises a retaining hole configured to receive the tab of the retaining member.

20. The mounting mechanism as described in claim 19, wherein the releasing member is capable of being pivoted to prize the locking portion of the retaining member away from the slide rail and disengage the tab of the retaining member from the retaining hole of the intermediate member.

* * * * *